United States Patent [19]

Kanno

[11] 4,433,805
[45] Feb. 28, 1984

[54] SOLDERING METHOD FOR ELECTRIC AND OR ELECTRONIC COMPONENTS

[75] Inventor: Akira Kanno, Iwate, Japan

[73] Assignee: Aiwa Co., Ltd., Tokyo, Japan

[21] Appl. No.: 290,340

[22] Filed: Aug. 5, 1981

[30] Foreign Application Priority Data

Apr. 10, 1981 [JP] Japan ................... 56-53040

[51] Int. Cl.³ .............................................. H05K 3/34
[52] U.S. Cl. ................... 228/180 R; 228/37; 228/259
[58] Field of Search ................ 228/259, 260, 262, 37, 228/39, 36, 180 R

[56] References Cited

U.S. PATENT DOCUMENTS

| 3,705,457 | 12/1972 | Tardoskegyi | 228/37 X |
| 3,874,068 | 4/1975 | Cook | 228/37 |
| 4,019,671 | 4/1977 | Akyuerek | 228/259 X |
| 4,375,271 | 3/1983 | Tsuchikura | 228/259 X |

Primary Examiner—Nicholas P. Godici
Assistant Examiner—M. Jordan
Attorney, Agent, or Firm—Birch, Stewart, Kolasch & Birch

[57] ABSTRACT

Compressed air is blown into a pool of molten solder during soldering to form air bubbles which rapidly rise in the molten solder toward the top. The rising air bubbles strike against a printed circuit board and electric and or electronic components temporarily fixed thereto to achieve soldering. After soldering, inert gas is introduced into the molten solder instead of the air.

5 Claims, 2 Drawing Figures

F I G. 1
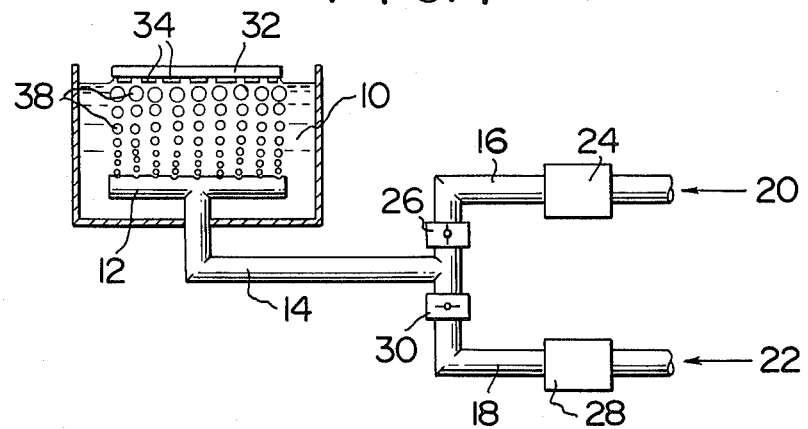
F I G. 2
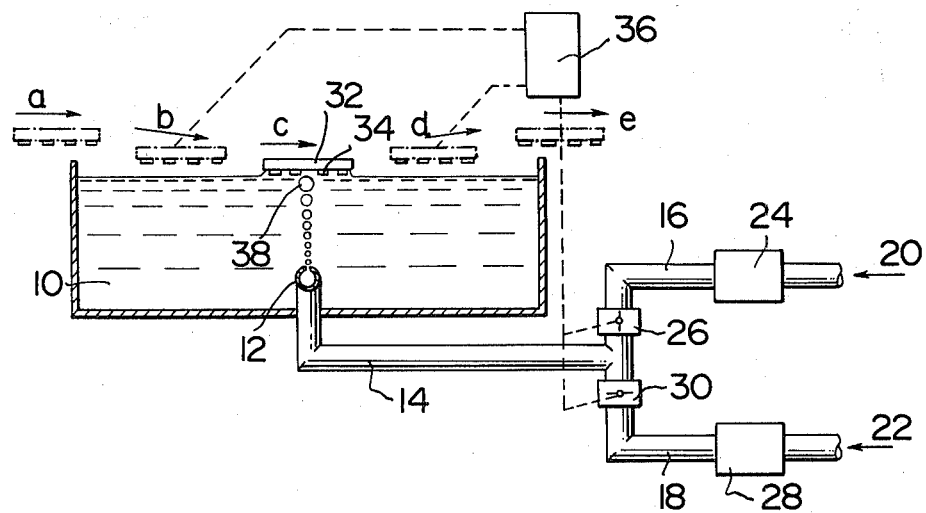

SOLDERING METHOD FOR ELECTRIC AND OR ELECTRONIC COMPONENTS

The present invention relates to a method for soldering electric and or electronic components to a printed circuit board using a pool of molten solder, and more particularly, to a soldering method of a type wherein the soldering is effected under action of bubbles formed in a pool of molten solder.

It has been known in the art heretofore that electric and or electronic components including chip type components temporarily bonded to a printed-circuit board are soldered to it by dipping the circuit surface into a static or wave pool of molten solder. In such a soldering system, generation of flux gas and gas from the printed-circuit board itself takes place in soldering operation and the gases tend to accumulate around terminal portions of the chip components to be soldered. The accumulated gases interfere with uniform soldering of the chip components to the circuit board. In order to eliminate this disadvantage, an attempt has been made to employ a bubble type pool of molten solder wherein bubbles are formed in the molten solder by blowing gas or liquid into the molten solder which strike against a printed circuit board having electric and or electronic components temporarily fixed thereto to expel any flux gas out of terminal portions of the chip components, thereby uniformly soldering the circuit board and the chip components to each other. In a typical embodiment, safe inexpensive inert gas such as nitrogen gas is selected for formation of bubbles in the molten solder. However, it has been found that when striking the bubbles of inert gas against the circuit board and the components, there is a tendency for the bubbles of inert gas to spread out portions of the molten solder through apertures (for lead wires of discrete components, integrated circuits and the like) in the printed-circuit board onto its opposite surface. In a case where circuits are printed on both surfaces of the board, portions of the molten solder which spread out onto the opposite surface may create improper electric connections of the components to the circuit on the surface resulting in a short circuit. An experiment shows that this disadvantage can be eliminated by employing air for formation of bubbles. However, oxidation of the molten solder takes place by continuously blowing the air thereinto for a long time so that undesirable solder dross accumulates on the top of the molten solder which interferes with soldering of the components.

Accordingly, a main object of the present invention is to provide a novel soldering method eliminating disadvantages as described hereinbefore.

Another object of the present invention is to provide a soldering method for soldering to a printed circuit board, electric and/or electronic components temporarily fixed thereto by blowing air into a pool of molten solder and by striking air bubbles against the board and the components during soldering operation.

This object is achieved by providing a soldering method wherein during soldering operation, air bubbles are formed in the pool of molten solder by blowing compressed air thereinto and the air bubbles strike against the printed circuit board and the components temporarily fixed thereto which are conveyed along the top of the molten solder to effect soldering of the board and the components to each other. After soldering, inert gas is introduced into the molten solder to minimize its oxidation.

These and other objects and advantages of the present invention will become apparent from the following description made with reference to the accompanying drawings, in which:

FIG. 1 is a transverse cross-sectional view showing a preferred embodiment of a soldering apparatus suitable to carry out a soldering method according to the present invention; and FIG. 2 is a longitudinal cross-sectional view of the soldering apparatus as shown in FIG. 1.

Referring to FIGS. 1 and 2 of the drawings, there is shown a bubble type pool of molten solder 10 according to the present invention which comprises a nozzle unit 12 disposed in the pool of molten solder for blowing gases thereinto. The nozzle unit 12 is connected to a pipe 14 at its forward end and, at the other end, the pipe 14 is connected to an air supply line 16 and an inert gas supply line 18 which are connected to a source of compressed air 20 and a gas cylinder 22 containing inert gas such as nitrogen gas, respectively. The air supply line 16 includes regulator 24 for regulating flow of the compressed air from the source 20 and an electromagnetic valve 26 for controlling supply of the compressed air through the pipe 14 to the nozzle unit 12. The inert gas supply line 18 includes a regulator 28 for regulating flow of the inert gas from the cylinder 22 and an electromagnetic valve 30 for controlling supply of the inert gas through the pipe 14 to the nozzle unit 12.

Printed circuit board 32 having electric and/or electronic components 34, including chip type components, temporarily fixed thereto are conveyed along the top of the pool of molten solder 10, following a path as indicated by arrows a, b, c, d and e in FIG. 2 of the drawings.

A device 36 is provided for detecting a position b of the circuit board 32 approaching the top of the molten solder before soldering and a position d of the board 32 leaving from the top of the molten solder after soldering to electrically actuate the electromagnetic valves 26 and 30. When the detecting device 36 electrically senses the board 32 at the position b, the electromagnetic valve 26 is opened to supply the compressed air from its source 20 to the nozzle unit 12 whereas the electromagnetic valve 30 is closed. When the device 36 senses the board 32 at its position d, the electromagnetic valve 26 is closed whereas the electromagnetic valve 30 is opened to supply the inert gas from its cylinder 22 to the nozzle unit 12.

The soldering apparatus is operated as follows:

As the printed circuit board 32 is conveyed from its position a to the approaching position b, detecting device 36 electrically senses the board 32 at position b to actuate the electromagnetic valve 26 from its closed position to an open position while keeping the electromagnetic valve 30 closed. Then, compressed air from the air supply line 16 and pipe 14 is blown through the nozzle unit 12 into the molten solder to form air bubbles 38 which rapidly rise toward the top of the molten solder. The rising air bubbles strike against the printed circuit board 32 with the chip components 34 temporarily bonded thereto, which is conveyed from the approaching position b to a soldering position c where the chip components 34 are uniformely soldered to the circuit board 32 under the action of the rising air bubbles 38 without reading out any molten solder through apertures (not shown) in the board. After soldering the board 32 is conveyed from the soldering position c to the leaving position d where the detecting device 36 electrically senses existance of the board 32 to close the valve 26 for interruption of the supply of air and to open the valve 30 for introduction of insert gas from its cylinder 22 through the gas supply line 18, pipe 14 and nozzle unit 12 into the molten solder. The introduction of the inert gas into the molten solder causes any air remaining in the pipe 14 to expel out of the pipe 14 and the nozzle unit 12 thereby preventing the molten solder from being oxidized in the nozzle unit 12 and removing any solder dross accumulated on the nozzle unit 12. When the inert gas has been introduced through the nozzle unit 12 into the molten solder a predetermined time, the valve 30 is closed for interruption of the supply of the inert gas by actuating it through a timer (not shown) in the detecting device 36. Alternatively, introduction of the inert gas into the molten solder may be continued until air begins to be blown into the molten solder for soldering. Although in the preferred embodiment as shown in the drawings, it has been described that the inert gas is introduced into the molten solder when the board is in the leaving position d, the introduction of the inert gas may be begun immediately after the soldering has been completed.

It will be understood from the foregoing that there has been provided a soldering method for soldering to a printed circuit board, electric and/or electronic components temporarily fixed thereto using a bubble type pool of molten solder, wherein compressed air is introduced into the molten solder during soldering to form air bubbles which rapidly rise in the molten solder toward its top, the rising bubbles strike against the board and components to solder them together, and after soldering, the supply of air is interrupted while inert gas is introduced into the molten solder. According to the present invention, production of undesirable solder dross can be reduced by blowing air into the molten solder for a short time to be required for soldering. Moreover, any air remaining in the pipe and the nozzle unit after interruption of the supply of air thereto is expelled into the molten solder by introducing the inert gas through the pipe and the nozzle unit into the molten solder to minimize production of undesirable solder dross in the nozzle unit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A soldering method for soldering components to a printed-circuit board using a bubble type pool of molten solder, comprising introducing compressed air into the molten solder during soldering to form air bubbles which rapidly rise in the molten solder striking against the board and components to achieve soldering of the components to the board, interrupting the supply of compressed air after soldering and, subsequently, introducing inert gas into the molten solder.

2. A soldering method as in claim 1, wherein said printed-circuit board is conveyed in a path along the top of a pool of molten solder, said compressed air is introduced into the molten solder in response to sensing said board in a position in said path prior to being in a soldering position, and the compressed air introduction is interrupted and said inert gas is introduced into the molten solder in response to sensing said board in a position after said soldering position.

3. An apparatus for soldering printed-circuit boards or the like comprising:
   a pool of molten solder;
   a compressed air supply means for introducing compressed air into said pool; and
   an inert gas supply means for introducing inert gas into said pool.

4. An apparatus for soldering printed-circuit boards or the like as in claim 3, further including a sensing device for sensing the position of a board, in response to which either compressed air or inert gas is introduced into said solder.

5. An apparatus for soldering printed-circuit boards or the like as in claim 3, wherein said compressed air supply means and said inert gas supply means join external to said pool to form a common supply means having an opening in said pool for introducing compressed air or inert gas.

* * * * *